(12) United States Patent
Leyden et al.

(10) Patent No.: US 8,227,048 B2
(45) Date of Patent: Jul. 24, 2012

(54) PHOTOCURABLE COMPOSITIONS FOR PREPARING ABS-LIKE ARTICLES

(75) Inventors: Richard N. Leyden, Topanga, CA (US); Laurence Messe, Blotzheim (FR); Frank Tran, The Woodlands, TX (US); David L. Johnson, The Woodlands, TX (US); John Wai Fong, Temple City, CA (US); Carole Chapelat, Saint Louis (FR); Ranjana C. Patel, Little Hallingbury (GB)

(73) Assignee: 3D Systems, Inc., Rock Hill, SC (US)

( * ) Notice: Subject to any disclaimer, the term of this patent is extended or adjusted under 35 U.S.C. 154(b) by 864 days.

(21) Appl. No.: 12/066,694

(22) PCT Filed: Sep. 12, 2006

(86) PCT No.: PCT/EP2006/066264
§ 371 (c)(1),
(2), (4) Date: Nov. 20, 2008

(87) PCT Pub. No.: WO2007/031505
PCT Pub. Date: Mar. 22, 2007

(65) Prior Publication Data
US 2011/0293891 A1 Dec. 1, 2011

Related U.S. Application Data

(60) Provisional application No. 60/716,665, filed on Sep. 13, 2005.

(51) Int. Cl.
*G03C 5/00* (2006.01)
*G03F 7/00* (2006.01)
*G03F 7/16* (2006.01)
*C08J 3/28* (2006.01)

(52) U.S. Cl. ............. 427/510; 430/269; 430/280.1; 522/170

(58) Field of Classification Search .......... 430/269, 430/280.1; 522/170; 427/510, 508
See application file for complete search history.

(56) References Cited

U.S. PATENT DOCUMENTS

| | | | |
|---|---|---|---|
| 5,972,563 A * | 10/1999 | Steinmann et al. | 430/280.1 |
| 6,379,866 B2 * | 4/2002 | Lawton et al. | 430/280.1 |
| 2003/0104313 A1 * | 6/2003 | Lawton | 430/280.1 |
| 2010/0119835 A1 * | 5/2010 | Messe et al. | 428/414 |

FOREIGN PATENT DOCUMENTS

| | | |
|---|---|---|
| JP | 10158581 | 6/1998 |
| WO | WO 01/59524 | 8/2001 |
| WO | 03/093901 | 11/2003 |
| WO | WO 2005/045523 | 5/2005 |
| WO | 2006/098676 | 9/2006 |
| WO | 2006/118532 | 11/2006 |
| WO | 2007/031505 | 3/2007 |
| WO | 2008/110512 | 9/2008 |

OTHER PUBLICATIONS

Database WPI Week 199834 Thomson Scientific, London, GB; AN 1998-393700 XP002479295.

* cited by examiner

*Primary Examiner* — Susan W Berman

(57) ABSTRACT

The present invention provides a clear, low viscosity photocurable composition including (i) a cationically curable compound (ii) an acrylate-containing compound (iii) a polyol-containing mixture (iv) a cationic photoinitiator and (v) a free radical photoinitiator. The photocurable composition can be cured using rapid prototyping techniques to form opaque-white three-dimensional articles having ABS-like properties.

14 Claims, No Drawings

PHOTOCURABLE COMPOSITIONS FOR PREPARING ABS-LIKE ARTICLES

CROSS REFERENCE TO RELATED APPLICATIONS

This application is the National Phase of International Application PCT/EP2006/066264 filed Sep. 12, 2006 which designated the U.S and which claims priority to U.S. Patent App. Ser. No. 60/716,665 filed Sep. 13, 2005. The noted application is incorporated herein by reference.

FIELD OF THE INVENTION

The present invention is directed to a clear, low viscosity photocurable composition comprising (i) a cationically curable compound (ii) an acrylate-containing compound (iii) a polyol containing mixture (iv) a cationic photoinitiator and (v) a free radical photoinitiator and its use in producing opaque three-dimensional articles using rapid prototyping techniques.

BACKGROUND OF THE INVENTION

Liquid-based Solid Imaging is a process whereby a photoformable liquid is coated into a thin layer upon a surface and exposed imagewise to actinic radiation, for example UV directed by laser for StereoLithography, such that the liquid solidifies imagewise. Subsequently, new thin layers of photoformable liquids are coated onto previous layers of liquid or previously solidified sections. The new layers are then exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding liquid composition. In some applications, it is beneficial to view the partially completed article under the liquid resin surface during the building of the article to allow for the determination of whether to abort the build or modify the building parameters on subsequent layers or future builds.

One of the most important advantages of the solid imaging process is the ability to rapidly produce actual articles that have been designed by computer aided design. A significant amount of progress has been made with compositions and processes that have been adapted to improve the accuracy of the articles produced. Also, composition developers have made significant progress toward improving individual properties such as the modulus or Heat Deflection Temperature (also called HDT being the temperature at which a sample of material deforms under a specified load) of the photohardened articles. Typically, a material with a higher HDT will perform better, that is, resist distortion better, in high-heat situations.

However, attempts to simulate a particular set of physical properties of a common manufacturing material to such a degree that the finished article could be easily mistaken for the manufacturing material, based upon look and feel properties, have been limited. For example, U.S. Pat. Nos. 6,287,748 and 6,762,002 describe photocurable compositions used to produce articles having the look and feel of polyethylene and polypropylene articles.

It would be desirable to produce a clear, low viscosity photocurable composition which, upon cure in a stereolithography process, produces an opaque article having the look and feel of the manufacturing material acrylonitrile-butadiene-styrene ("ABS").

It is known to put various materials in the UV curable resins in order to achieve an opaque article. For example, U.S. Pat. No. 4,942,060 describes use of phase separation in acrylic resins in a process to control depth of curing.

Especially important for the laser based stereolithography process are formulations based on epoxy-acrylic resin mixtures. These formulations further require tougheners to produced balanced mechanical properties. For example U.S. Pat. No. 5,476,748, and subsequent art with such specialised epoxy-acrylic hybrid compositions, disclose use of at least one hydroxy containing 'toughener' from either a hydroxy polyester, polyether or polyurethane. There is no mention of using those tougheners which are phase separated to yield toughened, higher HDT compositions.

WO 2005/045523 describes clear resins compositions which on curing give high HDT cured articles. The emphasis is especially regarding non-hydroxy containing acrylic component which is compatible with the epoxy content and the cured resin is a clear polymer.

US 2005/072519 describes certain epoxy-acrylic resins which give stable tensile properties. This involves hybrid compositions without glycidyl epoxy compound.

US 2003/198824 describes epoxy-acrylic resins containing pre-formed reactive particles which provide toughness in the cured resin. Reactive particles containing polysiloxane are described, used in low concentration, to especially yield ABS like properties and glossy cured surfaces.

U.S. Pat. No. 5,972,563 concerns epoxy-acrylic hybrid systems with various hydroxy containing compounds, specifically aromatic compounds with hydroxy groups. The emphasis is to achieve water resistance in the cured resin.

U.S. Pat. No. 5,476,748 sets requirements for accuracy and mechanical properties. There is no mention of using tougheners which are phase separated to yield toughened, higher HDT compositions. Examples show polyester diol containing examples.

In previous art, there is no specific mention of examples of mixed polyols in epoxy-acrylic hybrids which allow differential & preferential separation of toughening microphase domains. These types of clear compositions which go opaque are important as low viscosity, needed in operation of the equipment, for example an SL machine, can be achieved, yet yield desired high toughness. Pre-formed tougheners usually cannot be loaded up in effective amounts due to increases in viscosity.

SUMMARY OF THE INVENTION

Users now desire to view the partially completed part under the resin surface during the part building. Doing so, enables them to make decisions about aborting the build or modifying the build parameters on subsequent layers or future builds. Clear curing or Opaque liquid resins prevent this highly desirable property.

Also, agents which cause opaque liquids can cause problems for the SL resin. Some additives have been found to cause bubbles. In other cases, they may require higher than optimum viscosity.

In addition to above, there is an increasing need for improved performance of rapid prototyping parts. The present invention not only provides resins that change colour during cure, but also the final parts present better mechanical properties and thermal resistance. They also have the look of a white thermoplastic, which is a desired property for a large number of users.

Requirement for UV curable stereolithography resins which go from clear to opaque is a new desire from customers. Previous mention of such resins is in U.S. Pat. No. 4,942,060, describing acrylic resins. No epoxy-acrylic hybrids are mentioned. Besides, the goal is to process of depth control/accuracy and not toughening/improved mechanical properties.

It has been found that a combination of polyols and low molecular weight alcohols or epoxy can produce an optimal opacifying effect, combined with good mechanical properties and thermal resistance. The combination providing the desired effect is a mixture of component (1), formed of at least one compound of low to medium molecular weight which can be either an alcohol or an epoxy, and component (2) which is at least one polyol of higher molecular weight than component (1). It has been observed that a mixture of (1) at least one low to medium molecular weight component, which can be either an alcohol or an epoxy and (2) at least one polyol of higher molecular weight than (1) will apparently undergo a phase separation of the polyol during UV-curing, causing the clear, homogeneous liquid resin to turn into a white solid. It has been surprisingly found that the presence of a small amount of the low molecular weight component (1) enhances the phase separation of the higher molecular weight polyol (2), leading to much improved mechanical properties.

An alternative way of increasing toughening, well known to people skilled in the art, would be to increase the amount of polyol (2). However, this method would result in a loss of moduli and HDT, and an undesired increase in viscosity. Our invention allows to enhance the efficiency of the polyol (2) as toughener without increasing viscosity and maintaining or improving the moduli and HDT.

It is known that medium to high molecular weight polyols phase separate during curing of hybrid formulations, due to increased incompatibility during the cure process. The extent of the phase separation depends on a number of parameters such as: the chemical structure of the polyol (PPO (poly [propylene oxide]), PEO (poly[ethylene oxide]), PolyTHF (tetrahydrofurane), polybutadiene, epoxidised polybutadiene, polyester, polyurethane, etc. . . . ), its functionality (linear, 3-arms star, higher functionality, branched, grafted or hyperbranched etc. . . . ), the class of the hydroxyl end-groups (primary or secondary), its molecular weight, the amount present in the formulation. Depending on all of these parameters, the phase separation may not occur at all: the cured formulation is as clear and transparent as the liquid resin. Such clear cured formulations have good flexibility and consequently usually low HDT. The phase separation can occur but only slightly: the solid resin is slightly opalescent. If the phase separation occurs to a stronger extend, the solid resin can have a more or less hazy look.

It has now been discovered that a low molecular weight alcohol or epoxy (component (1)) can intensify the phase separation of the polyol (component (2)) to such an extent that the solid part appears white, while retaining good mechanical and thermal properties.

Surprisingly, certain specifically mixed polyol-containing mixtures are compatible with curable epoxy-acrylic resins, and yield low viscosity compositions which, on curing under the stereolithography conditions, form toughened, high HDT objects. It is believed that compositions comprising these specific polyol mixtures contain controllably separated microphase areas of the polyol mixture, forming opaque and toughening microphase areas in the cured epoxy acrylic hybrid resin.

Without wishing to be bound by theory, it is believed that the invention particularly uses low molecular weight compound, such as alcohol or epoxy functional, to facilitate the separation of higher molecular weight polyols. The higher molecular weight polyols provide the toughness: however, by themselves the higher molecular weight polyol cannot separate easily from the curable and curing resin matrix. If not cleanly separated from the curing resin matrix, the polyol then behaves as a flexibilizer, lowering the thermal characteristics of the cured resin, e.g. HDT and Tg, and modulus.

A mixture of low molecular weight compound with a higher molecular weight polyol gives the surprising best compromise of low viscosity and compatibility with the epoxy-acrylic matrix and higher toughness, and with better compromise in flexibility versus losses in HDT.

Component (1) is one or more alcohol or epoxy molecule of low to medium molecular weight, that intensifies the phase separation of the higher molecular weight polyol. This alcohol or epoxy molecule can be aliphatic, alicyclic, or aromatic. It can be monofunctional, difunctional or of higher functionality. The hydroxyl groups can be either primary, secondary, of tertiary.

Component (1) can also be an acrylate compound, especially a slowly reacting acrylate compound, like an acrylate compound where the acrylate function is sterically hindered, or a methacrylate compound.

The preferred component (1) is, by order of preference: polyol>epoxy>acrylate>monoalcohol. Therefore preferably component (1) is a polyol or an epoxy compound.

In the examples, the molecular weight of component (1) can be as low as 60 g/mol (isopropanol) and can go up to 4800 (Desmophen PU21IK01). More generally, it is preferably less than 6000, more preferably less than 5000.

Component (2): is one or more polyol of higher molecular weight than component (1), that undergoes phase separation upon polymerisation. The phase separation of this polyol is intensified by the presence of component (1). This polyol can be a polyether polyol, polyester polyol, polyurethane polyol, hydroxyl-terminated polysiloxane, etc. It can be linear (difunctional polyol) or branched (trifunctional or higher functionality), or star-like (trifunctional or higher functionality). Preferably, in order to ensure proper phase separation, the molecular weight of polyol (2) is higher than 1000, preferably higher than 1500. In the examples, the molecular weight of this polyol varies between 2000 g/mol up to 11200 g/mol (Acclaim® 12200) and more.

The composition contains 5-40% of the mixture of (1) and (2).

It is known to the person skilled in the art that polyols of high molecular weights will undergo phase separation upon UV polymerisation of the formulation, due to the change in the interaction causing the long chains to become more and more incompatible with the matrix. Use of polyols as flexibilisers and tougheners usually results in a softening of the matrix, causing the tensile and flexural moduli to drop, and resulting in lower thermal resistance. These polyols also have high viscosity, and increase significantly the viscosity of the final compositions.

What was not known and was non-obvious to the person skilled in the art is that adding a low molecular weight alcohol (component (1)) we can enhance the phase separation of component (2), without degradation of the mechanical properties.

We surprisingly found that the phase separation of high molecular weight polyols (component (2)) is enhanced by the presence of low MW alcohols or epoxy (component (1)), and that the domains formed in this manner provide a better toughening effect than in the absence of the low MW alcohol or epoxy. We surprisingly found that in this manner, the parts produced had the appearance of a white thermoplastic, even though the starting liquid resin was clear, which adds value to the customer, and that the final objects manufactured were tough but retained rigidity, and had great thermal resistance. Additionally, the invention may provide all these benefits without any increase in viscosity, which is the well known drawback of toughening epoxy systems with polyols.

Preferably, compound (1) is different from polycarbonate polyol.

In a preferred embodiment, compound (1) is a polyol which can be linear or branched poly(oxytetramethylene), poly(oxypropylene), poly(oxyethylene), hydroxy-terminated polybutadiene.

Preferably, compound (2) is a polyoxyalkylene polyol, a polyether polyol, polyester polyol, or polyurethane polyol.

Preferably, compound (1) is added in an amount of at least 0.1 g per each g of polyol (2).

Preferably, the polyacrylate component contains a diacrylate compound or is formed essentially of a diacrylate.

The epoxy-containing component can contain one epoxy compound or a mixture of different epoxy compounds.

The photocurable composition is a clear liquid. Typically its viscosity determined at 30° C. is below 1000 mPa·s (Centipoise cP). It forms under curing an opaque solid. Preferably this opaque cured solid has a Lightness L* (measured as defined hereinafter) of at least 65, more preferably at least 69. Solid parts with L* less than 65 appears hazy or opalescent to the eye, which is not preferred.

Besides forming 3 Dimensional objects by conventional, laser directed stereolithography, compositions according to the invention can be used for other UV or visible non based 3-dimensional modeling (for example ink jet based systems and light valves exposed media). It can be used for photocurable coatings and inks, solder masks, cladding for optical fibres.

In one embodiment, the invention particularly uses low molecular weight polyols to facilitate separation of higher Mwt polyols, thus allowing low viscosity, yet higher toughness, and better compromise in flexibility versus losses in HDT. In this embodiment, the composition is as follows: a clear, low viscosity photocurable composition containing about 40-80% by weight of a cationically curable compound, about 5-40% by weight of an acrylate-containing compound, about 5-40% by weight of a reactive toughening polyol mixture comprising at least two polyols: (1) a polyol having a hydroxyl equivalent weight of 180-1500 g/OH equivalent and which can be linear or branched poly(oxytetramethylene), poly(oxypropylene), poly(oxyethylene), hydroxy-terminated polybutadiene or hydroxy-terminated polysiloxane; and (2) at least one other polyol having a hydroxyl equivalent weight of 230-7000 g/OH equivalent and which can be a polyether polyol, polyester polyol, or polyurethane polyol, about 0.2-10% by weight of a cationic photoinitiator, about 0.01-10% by weight of a free radical photoinitiator, and optionally one or more stabilizers, where the percent by weight is based on the total weight of the photocurable composition. The photocurable composition of claim 1 wherein the polyol is a poly(oxytetramethylene) polyol.

Preferably, in the photocurable composition, the molar ratio of the poly(oxytetramethylene)diol over the polyol of component (2) is equal to or less than 25.

More preferably, this molar ratio is equal to or less than 10, or equal to less than 5.

Preferably, the polyol of component (2) is a polyether polyol.

Preferably, the photocurable composition is clear and after cure by exposure to actinic radiation is opaque-white that simulates ABS.

Preferably, the photocurable composition comprises:
a) about 40-80% by weight of an epoxy-containing compound;
b) about 5-40% by weight of a difunctional (meth)acrylate;
c) about 5-40% by weight of a polyol mixture comprising
   (1) a polyol having a hydroxyl equivalent weight of 180-1500 g/OH equivalent and which can be linear or branched poly(oxytetramethylene), poly(oxypropylene), poly(oxyethylene), hydroxy-terminated polybutadiene or hydroxy-terminated polysiloxane; and
   (2) at least one other polyol having a hydroxyl equivalent weight of 230-7000 g/OH equivalent and which can be a polyether polyol, a polyester polyol or a polyurethane polyol;
d) about 0.2-10% by weight of a cationic photoinitiator;
e) about 0.01-10% by weight of a free radical photoinitiator; and optionally
f) one or more stabilizers
   wherein the percent by weight is based on the total weight of the photocurable composition and wherein the photocurable composition, after cure by exposure to actinic radiation and optionally heat, has a tensile strength within the range from about 30-65 MPa, a tensile elongation at break within the range from about 2-110%, a flexural strength within the range from about 45-107 MPa, a flexural modulus within the range from about 1600-5900 MPa, a notched izod impact strength of less than 12 ft lb/in and a heat deflection temperature (at 0.46 MPa) within the range from about 68-140° C.

The invention extends to a process comprising:
g) coating a layer of the photocurable composition of claim 1 onto a surface;
h) exposing the layer imagewise to actinic radiation to form an imaged cross-section, wherein the radiation is of sufficient intensity to cause substantial curing of the layer in the exposed areas;
i) coating a thin layer of the composition of claim 1 onto the previously exposed imaged cross-section;
j) exposing the thin layer from step (c) imagewise to actinic radiation to form an additional imaged cross-section, wherein the radiation is of sufficient intensity to cause substantial curing of the thin layer in the exposed areas and to cause adhesion to the previously exposed imaged cross-section; and
k) repeating steps (c) and (d) a sufficient number of times in order to build up a three-dimensional article.

Preferably the polyol mixture contains or is derived from 'hydrophobic polyols'.

The photocurable composition can be cured by coating a layer of the composition onto a surface and exposing the layer imagewise to actinic radiation of sufficient intensity to cause substantial curing of the layer in the exposed areas so that an imaged cross-section is formed. A thin layer of the photocurable composition may then be coated onto the prior imaged cross-section and exposed to actinic radiation of sufficient intensity to cause substantial curing of the thin layer and to cause adhesion to the prior imaged cross-section. This may be repeated a sufficient number of times for the purpose of building up a three-dimensional article having similar appearance and mechanical properties as ABS.

DETAILED DESCRIPTION OF THE INVENTION

The present invention relates to photocurable compositions containing a cationically curable compound, an acrylate-containing compound, a polyol mixture and cationic and free radical photoinitiators and optionally one or more stabilizers. It has been surprisingly found that when these components are combined, a clear, low viscosity photocurable composition is produced which, under fast laser curing, produces an opaque three dimensional article having an excellent balance of toughness, flexibility and a high heat deflection temperature similar to ABS.

Cationically Curable Compound

As a first component, the photocurable composition of the present invention includes from 30 to 80% by weight, preferably 40-80% by weight, based on the total weight of the photocurable composition, of at least one cationically curable compound or resin characterized by having functional groups capable of reacting via or as a result of a ring-opening mechanism to form a polymeric network. Examples of such functional groups include oxirane-(epoxide), oxetane-, tetrahydrofuran- and lactone-rings in the molecule. Such compounds may have an aliphatic, aromatic, cycloaliphatic, araliphatic or heterocyclic structure and they may contain the ring groups as side groups, or the epoxide group can form part of an alicyclic or heterocyclic ring system.

In one embodiment, the cationically curable compound is an epoxy-containing compound. In general, any epoxy-containing compound is suitable for the present invention, such as the epoxy-containing compounds disclosed in U.S. Pat. No. 5,476,748 which is incorporated herein by reference.

In one embodiment, preferred epoxy-containing compounds suitable for use in the present invention are non-glycidyl epoxies. These epoxies may be linear, branched, or cyclic in structure. For example, there may be included one or more epoxide compounds in which the epoxide groups form part of an alicyclic or heterocyclic ring system. Others include an epoxy-containing compound with at least one epoxycyclohexyl group that is bonded directly or indirectly to a group containing at least one silicon atom. Examples are disclosed in U.S. Pat. No. 5,639,413, which is incorporated herein by reference. Still others include epoxides which contain one or more cyclohexene oxide groups and epoxides which contain one or more cyclopentene oxide groups.

Particularly suitable non-glycidyl epoxies include the following difunctional non-glycidyl epoxide compounds in which the epoxide groups form part of an alicyclic or heterocyclic ring system: bis(2,3-epoxycyclopentyl)ether, 1,2-bis(2,3-epoxycyclopentyloxy)ethane, 3,4-epoxycyclohexylmethyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl)hexanedioate, di(3,4-epoxy-6-methylcyclohexylmethyl) hexanedioate, ethylenebis(3,4-epoxycyclohexanecarboxylate, ethanediol di(3,4-epoxycyclohexylmethyl)ether, vinylcyclohexene dioxide, dicyclopentadiene diepoxide or 2-(3,4-epoxycyclohexyl-5,5-spiro-3,4-epoxy)cyclohexane-1,3-dioxane, and 2,2'-Bis-(3,4-epoxy-cyclohexyl)-propane.

Highly preferred difunctional non-glycidyl epoxies include cycloaliphatic difunctional non-glycidyl epoxies, such as 3,4-epoxycyclohexyl-methyl 3',4'-epoxycyclohexanecarboxylate and 2,2'-Bis-(3,4-epoxy-cyclohexyl)-propane, with the former being most preferred.

In another embodiment, the epoxy-containing compound is a polyglycidyl ether, poly(β-methylglycidyl) ether, polyglycidyl ester or poly(β-methylglycidyl) ester. The synthesis and examples of polyglycidyl ethers, poly(β-methylglycidyl) ethers, polyglycidyl esters and poly(β-methylglycidyl) esters are disclosed in U.S. Pat. No. 5,972,563, which is incorporated herein by reference.

Particularly important representatives of polyglycidyl ethers or poly(β-methylglycidyl)ethers are based on monocylic phenols, for example, on resorcinol or hydroquinone, or polycyclic phenols, for example, on bis(4-hydroxyphenyl) methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks. Examples of suitable polyglycidyl ethers include trimethylolpropane triglycidyl ether, triglycidyl ether of polypropoxylated glycerol, and diglycidyl ether of 1,4-cyclohexanedimethanol. Examples of particularly preferred polyglycidyl ethers include diglycidyl ethers based on bisphenol A and bisphenol F and mixtures thereof. In a preferred embodiment are polyglycidyl ethers or poly(β-methylglycidyl)ethers of hydrogenated versions of above monocyclic phenols or polycyclic phenols.

The cationically curable compound may also be derived from polyglycidyl and poly(β-methylglycidyl) esters of polycarboxylic acids. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid.

In another embodiment, the cationically curable compound is a poly(N-glycidyl) compound or poly(S-glycidyl) compound. Poly(N-glycidyl) compounds are obtainable, for example, by dehydrochlorination of the reaction products of epichlorohydrin with amines containing at least two amine hydrogen atoms. These amines may, for example, be n-butylamine, aniline, toluidine, m-xylylenediamine, bis(4-aminophenyl)methane or bis(4-methylaminophenyl)methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin. Examples of Poly(S-glycidyl) compounds are di-S-glycidyl derivatives derived from dithiols, for example ethane-1,2-dithiol or bis(4-mercaptomethylphen-yl)ether.

It is also possible to employ epoxy-containing compounds in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Other epoxide derivatives may be employed, such as vinyl cyclohexene dioxide, vinyl cyclohexene monoxide, 3,4-epoxycyclohexylmethyl acrylate, 3,4-epoxy-6-methyl cyclohexylmethyl 9,10-epoxystearate, 1,2-bis(2,3-epoxy-2-methylpropoxy)ethane, and the like.

Also conceivable is the use of liquid pre-reacted adducts of epoxy-containing compounds, such as those mentioned above, with hardeners for epoxy resins. It is of course also possible to use liquid mixtures of liquid or solid epoxy resins in the novel compositions.

The following are examples of commercial epoxy products suitable for use in the present invention: Uvacure® 1500 (3,4-epoxycyclohexylmethyl-3',-4'-epoxycyclohexanecarboxylate, supplied by UCB Chemicals Corp.); Heloxy™ 48 (trimethylol propane triglycidyl ether, supplied by Resolution Performance Products LLC); Heloxy™ 107 (diglycidyl ether of cyclohexanedimethanol, supplied by Resolution Performance Products LLC); Uvacure® 1501 and 1502 are proprietary cycloaliphatic epoxides supplied by UCB Surface Specialties of Smyrna, Ga.; Uvacure® 1530-1534 are cycloaliphatic epoxides blended with a proprietary polyol; Uvacure® 1561 and Uvacure® 1562 are proprietary cycloaliphatic epoxides that have a (meth)acrylic unsaturation in them; Cyracure™ UVR-6100, -6105 and -6110 (are all 3,4-epoxycyclohexylmethyl-3',4'-epoxycyclohexanecarboxylate); Cyracure™ UVR-6128 (Bis(3,4-epoxycyclohexyl) Adipate), Cyracure™ UVR-6200, Cyracure™ UVR-6216 (1,2-Epoxyhexadecane, supplied by Union Carbide Corp. of Danbury, Conn.); Araldite® CY 179 (3,4-epoxycyclohexylmethyl-3',4'-epoxycyclohexanecarboxylate); PY 284 (digycidyl hexahydrophthalate polymer); Celoxide™ 2021 (3,4-epoxycyclohexyl methyl-3',4'-epoxycyclohexyl carboxylate), Celoxide™ 2021 P (3'-4'-Epoxycyclohexanemethyl 3'-4'-Epoxycyclohexyl-carboxylate); Celoxide™ 2081 (3'-4'-Epoxycyclohexanemethyl 3'-4'-Epoxycyclohexyl-carboxylate modified caprolactone); Celoxide™ 2083, Celoxide™ 2085, Celoxide™ 2000, Celoxide™ 3000, Cyclomer A200 (3,4-Epoxy-Cyclohexylmethyl-Acrylate); Cyclomer M-100 (3,4-Epoxy-Cyclohexylmethyl-Methacrylate); Epolead GT-300, Epolead GT-302, Epolead GT-400, Epolead 401, and Epolead 403 (by Daicel Chemical Industries Co., Ltd.). Epalloy® 5000 (epoxidized hydrogenated Bisphenol A, supplied by CVC Specialties Chemicals, Inc.) Other hydrogenated aromatic glycidyl epoxies may be used.

The photocurable composition of the present invention may include mixtures of the cationically curable compounds described above.

Acrylate-Containing Compound

As a second component, the photocurable composition of the present invention preferably includes from about 5-40% by weight, based on the total weight of the photocurable composition, of one or more acrylate-containing compounds. The acrylate-containing compound of the present invention is preferably ethylenically unsaturated. More preferably, the acrylate-containing compound is a (meth)acrylate. "(Meth)acrylate" refers to an acrylate, a methacrylate, or a mixture thereof. The acrylate-containing compound may include at least one poly(meth)acrylate, e.g., a di-, tri-, tetra- or pentafunctional monomeric or oligomeric aliphatic, cycloaliphatic, or aromatic (meth)acrylate.

In one embodiment, the acrylate-containing compound is a difunctional (meth)acrylate, for example, an aliphatic or aromatic difunctional (meth)acrylate. Examples of di(meth)acrylates include di(meth)acrylates of cycloaliphatic or aromatic diols such as 1,4-dihydroxymethylcyclohexane, 2,2-bis(4-hydroxycyclohexyl)propane, bis(4-hydroxycyclohexyl)methane, hydroquinone, 4,4'-dihydroxybiphenyl, Bisphenol A, Bisphenol F, Bisphenol S, ethoxylated or propoxylated Bisphenol A, ethoxylated or propoxylated Bisphenol F, and ethoxylated or propoxylated Bisphenol S. Di(meth)acrylates of this kind are known and some are commercially available, e.g., Ebecryl® 3700 (Bisphenol-A epoxy diacrylate) (supplied by UCB Surface Specialties). A particularly preferred di(meth)acrylate is a Bispenol A-based epoxy diacrylate.

Alternatively, the di(meth)acrylate may be acyclic aliphatic, rather than cycloaliphatic or aromatic. Di(meth)acrylates of this kind are generally known and include compounds of the formulae (F-I) to (F-IV) of U.S. Pat. No. 6,413,697, which is herein incorporated by reference. Further examples of possible di(meth)acrylates are compounds of the formulae (F-V) to (F-VIII) of U.S. Pat. No. 6,413,697. Their preparation is also described in EP-A-0 646 580, which is herein incorporated by reference. Some compounds of the formulae (F-I) to (F-VIII) are commercially available.

A poly(meth)acrylate suitable for the present invention may include a tri(meth)acrylate or higher. Examples are the tri(meth)acrylates of hexane-2,4,6-triol, glycerol, 1,1,1-trimethylolpropane, ethoxylated or propoxylated glycerol, and ethoxylated or propoxylated 1,1,1-trimethylolpropane. Other examples are the hydroxyl-containing tri(meth)acrylates obtained by reacting triepoxide compounds (e.g., the triglycidyl ethers of the triols listed above) with (meth)acrylic acid. Other examples are pentaerythritol tetraacrylate, bistrimethylolpropane tetraacrylate, pentaerythritol monohydroxytri(meth)acrylate, or dipentaerythritol monohydroxypenta(meth)acrylate. Examples of suitable aromatic tri(meth)acrylates are the reaction products of triglycidyl ethers of trihydric phenols, and phenol or cresol novolaks containing three hydroxyl groups, with (meth)acrylic acid.

Preferably, the acrylate-containing compound includes a compound having at least one terminal and/or at least one pendant (i.e., internal) unsaturated group and at least one terminal and/or at least one pendant hydroxyl group. The photocurable composition of the present invention may contain more than one such compound. Examples of such compounds include hydroxy mono(meth)acrylates, hydroxy poly(meth)acrylates, hydroxy monovinylethers, and hydroxy polyvinylethers. Commercially available examples include dipentyaerythritol pentaacrylate (SR 399, supplied by SARTOMER Company); pentaerythritol triacrylate (SR 444, supplied by SARTOMER Company); and bisphenol A diglycidyl ether diacrylate (Ebecryl® 3700, supplied by UCB Surface Specialties).

The following are examples of commercial poly(meth)acrylates: SR 295 (pentaerythritol tetracrylate); SR 350 (trimethylolpropane trimethacrylate); SR 351 (trimethylolpropane triacrylate); SR 367 (Tetramethylolmethane tetramethacrylate); SR 368 (tris(2-acryloxy ethyl) isocyanurate triacrylate); SR 399 (dipentaerythritol pentaacrylate); SR 444 (pentaerythritol triacrylate); SR 454 (ethoxylated (3) trimethylolpropane triacrylate); SR 9041 (dipentaerythritol pentaacrylate ester); and CN 120 (bisphenol A-epichlorohydrin diacrylate) (supplied by SARTOMER Company).

Additional examples of commercially available acrylates include Kayarad® R-526 (hexanedioic acid, bis[2,2-dimethyl-3-[(1-oxo-2-propenyl)oxy]propyl]ester); Sartomer 238 (hexamethylenediol diacrylate); SR 247 (neopentyl glycol diacrylate); SR 06 (tripropylene glycol diacrylate); Kayarad® R-551 (Bisphenol A polyethylene glycol diether diacrylate); Kayarad® R-712 (2,2'-Methylenebis[p-phenylenepoly(oxy-ethylene)oxy]diethyl diacrylate); Kayarad® R-604 (2-Propenoic acid, [2-[1,1-dimethyl-2-[(1-oxo-2-propenyl)oxy]ethyl]-5-ethyl-1,3-dioxan-5-yl]-methyl ester); Kayarad® R-684 (dimethyloltricyclodecane diacrylate); Kayarad® PET-30 (pentaerythritol triacrylate); GPO-303 (polyethylene glycol dimethacrylate); Kayarad® THE-330 (ethoxylated trimethylolpropane triacrylate); DPHA-2H, DPHA-2C and DPHA-21 (dipentaerythritol hexaacrylate); Kayarad® D-310 (DPHA); Kayarad® D-330 (DPHA); DPCA-20; DPCA-30; DPCA-60; DPCA-120; DN-0075; DN-2475; Kayarad® T-1420 (ditrimethylolpropane tetraacrylate); Kayarad® 1-2020 (ditrimethylolpropane tetraacrylate); T-2040; TPA-320; TPA-330; Kayarad® RP-1040

(pentaerythritol ethoxylate tetraacrylate); R-011; R-300; R-205 (methacrylic acid, zinc salt, same as SR 634) (Nippon Kayaku Co., Ltd.); Aronix M-210; M-220; M-233; M-240; M-215; M-305; M-309; M-310; M-315; M-325; M-400; M-6200; M-6400 (Toagosei Chemical Industry Co, Ltd.); Light acrylate BP-4EA, BP-4PA, BP-2EA, BP-2PA, DCP-A (Kyoeisha Chemical Industry Co., Ltd.); New Frontier BPE-4, TEICA, BR-42M, GX-8345 (Daichi Kogyo Seiyaku Co., Ltd.); ASF-400 (Nippon Steel Chemical Co.); Ripoxy SP-1506, SP-1507, SP-1509, VR-77, SP-4010, SP-4060 (Showa Highpolymer Co., Ltd.); NK Ester A-BPE-4 (Shin-Nakamura Chemical Industry Co., Ltd.); SA-1002 (Mitsubishi Chemical Co., Ltd.); Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

The photocurable composition of the present invention may include mixtures of the acrylate-containing compounds described above.

Polyol Mixture

As a third component, the photocurable composition of the present invention includes a toughener which is a mixture of at least 2 compounds, which may be of same generic compound type and vary according to molecular weight, or maybe of at least 2 different compounds which furthermore have different molecular weight. The toughener mixture is initially compatible in the curable resin and should be transparent. The toughener mixture must separate out of the curable resin as stable microdomains of material finally present in the finally fully cured resin. The toughener mixture is present from about 5-40% by weight, based on the total weight of the photocurable composition, and is preferably made of such functionalities which do not react up with the main resin mixture, which is exemplified in this invention as the epoxy acrylic resin matrix. The phase separating toughener mixture is preferably made up of a reactive toughening polyol mixture containing at least two polyols: (i) a polyol having a hydroxyl equivalent weight of about 180-1500 g/OH equivalent, preferably 200-1000 g/OH equivalent, which can be linear or branched poly(oxytetramethylene), poly(oxypropylene), poly(oxyethylene), hydroxy-terminated polybutadiene, hydroxy-terminated polysiloxane or a mixture thereof; and (ii) at least one other polyol having a hydroxyl equivalent weight of about 230-7000 g/OH equivalent, preferably 350-5000 g/OH equivalent, more preferably 1300-3500 g/OH equivalent, which can be a polyether polyol, polyester polyol, polyurethane polyol or a mixture thereof. Especially preferred polyols are secondary polyols.

The reactive toughening polyol-containing mixture, which is initially compatible with the photocurable composition, on curing phase separates in a stable manner to produce a cured article which is no longer clear or transparent. The polyol mixture may contain polyols of similar chemical type or mixed chemical type.

In one embodiment, the first polyol is a linear or branched poly(oxytetramethylene)diol. Linear or branched poly(oxytetramethylene)diols are generally known and prepared by the polymerization of tetrahydrofuran in the presence of Lewis acid catalysts such as boron trifluoride, tin (IV) chloride and sulfonyl chloride. The hydroxyl equivalent weight of the linear and branched poly(oxytetramethylene)diols ranges from at least 180 to 1500, preferably from 300 to 1450, more preferably from 500 to 1000, and most preferably is 500. Commercially available poly(oxytetramethylene)diols include those available in the Polymeg® line (Penn Specialty Chemicals) and the polyTHF line from BASF. Commercially available hydroxy-terminated polybutadienes are PolyBD/R20LM and Crasol LDT2040 from Sartomer.

In another embodiment, the at least one other polyol is a polyether polyols having a hydroxyl equivalent weight of about 230-7000 g/OH equivalent, preferably about 350-5000 g/OH equivalent, and most preferably about 1300-3500 g/OH equivalent.

Examples of polyether polyols include various polyoxyalkylene polyols and mixtures thereof. The polyoxyalkylene polyols can be prepared, according to well-known methods, by condensing alkylene oxide, or a mixture of alkylene oxides using acid or base catalyzed addition, with a polyhydric initiator or a mixture of polyhydric initiators. Illustrative alkylene oxides include ethylene oxide, propylene oxide, butylene oxide, e.g., 1,2-butylene oxide, amylene oxide, aralkylene oxides, e.g., styrene oxide, and the halogenated alkylene oxides such as trichlorobutylene oxide and so forth. The more preferred alkylene oxides include butylene oxide, propylene oxide and ethylene oxide or a mixture thereof using random or step-wise oxyalkylation. Examples of such polyoxyalkylene polyols include polyoxyethylene, i.e., polyethylene triols, polyoxypropylene, i.e., polypropylene triols and polyoxybutylene, i.e., polybutylene triols. Commercially available polyoxyalkylene polyols include Arcol® LHT-28, Arcol® LHT-42, Acclaim® 4200, Acclaim® 6300 and Acclaim® 8200 (all from Bayer Materials Science) and Lupranol® VP9272, Lupranol® VP9289 and Lupranol® VP9350 (all from Elastogran).

In another embodiment, the at least one other polyol is a polyester polyol. Polyester polyols which may be used include hydroxyl-terminated reaction products of polyhydric alcohols and polycarboxylic acids. Examples of polyester polyols suitable for use include Tone Polyol 0310 from Dow and Desmophen 5035BT from Bayer. A preferred polyol type is alkoxylated polyol esters, example being butoxylated trimethylolpropane (Simulsol TOMB ex Seppic). These types are not prone to humidity effects and so can result in especially water resistant cured products.

In yet another embodiment, the at least one other polyol is a polyurethane polyol. Polyurethane polyols can be prepared by means generally known, such as the reaction between isocyanates with one or more diols and/or triols.

The amounts of each of components (i)=(1) and (ii)=(2) in the polyol mixture will vary depending on the desired whiteness of the cured article and its mechanical properties, such as toughness, modulus and water resistance. In one embodiment, the molar ratio of the polyols (i) over (ii) is equal to or less than 20, preferably equal to or less than 10, and more preferably equal to or less than 5.

Cationic Photoinitiator

As a fourth component, the photocurable composition of the present invention includes at least one cationic photoinitiatr, preferably in an amount from about 0.2-10% by weight, based on the total weight of the photocurable composition. The cationic photoinitiator may be chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Metallocene salts are also suitable as photoinitiators. Onium salt and metallocene salt photoinitiators are described in U.S. Pat. No. 3,708,296; J. V. Crivello, "Photoinitiated Cationic Polymerization," UV Curing: Science & Technology, (S. P. Pappas, ed., Technology Marketing Corp. 1978) and J. V. Crivello and K. Dietliker, "Photoinitiators for Cationic Polymerisation," Chemistry and Technology of UV & EV Formulation for Coatings, Inks & Paints 327-478 (P. K. Oldring, ed., SITA Technology Ltd 1991), each of which is incorporated herein by reference.

Examples of commercial cationic photoinitiators include Cyracure® UVI-6974 and UVI-6976 (which are a mixture of S,S,S,S'-Tetraphenylthiobis(4,1-phenylene)disulfonium dihexafluoroantimonate and diphenyl(4-phenylthiophenyl) sulfonium hexafluoroantimonate), Cyracure® UVI-6970, UVI-6960, UVI-6990 (DOW Corp.), CD1010, CD-1011, CD-1012 (Sartomer Corp.), Adekaoptomer SP150, SP-151, SP-170, SP-171 (Asahi Denka Kogyo Co., Ltd.), Irgacure® 261, CI-2481, CI-2624, CI-2639, CI2064 (Nippon Soda Co, Ltd.), and DTS-102, DTS-103, NAT-103, NDS-103, TPS-103, MDS-103, MPI-103, BBI-103 (Midori Chemical Co, Ltd.). Most preferred are UVI-6974, CD-1010, UVI-6976, Adekaoptomer SP-170, SP-171, CD-1012, and MPI-103 and KI78 (hexafluoroantimony sulfonium salt from Asahi Denka). Especially preferred is a mixture of S,S,S,S'-Tetraphenylthiobis(4,1-phenylene)disulfonium dihexafluoroantimonate and diphenyl(4-phenylthiophenyl)sulfonium hexafluoroantimonate. The cationic photoinitiators can be used either individually or in combination of two or more. The cationic photoinitiator can comprise a PF6 salt.

Free Radical Photoinitiator

As a fifth component, the photocurable composition of the present invention includes at least one free radical photoinitiator, preferably in an amount of from about 0.01-10% by weight, based on the total weight of the photocurable composition. The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylailthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin TPO); bisacylphosphine oxides; benzophenones, e.g., benzophenone and 4,4'-bis(N,N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure® 2959); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxycyclohexyl phenyl ketone, e.g., Irgacure® 184.

Other Components

The photocurable composition of the present invention may also include other components, for example, stabilizers, modifiers, tougheners, antifoaming agents, leveling agents, thickening agents, flame retardants, antioxidants, pigments, dyes, fillers, and combinations thereof.

Stabilizers which may be added to the photocurable composition to prevent viscosity build-up during usage include butylated hydroxytoluene ("BHT"), 2,6-Di-tert-butyl-4-hydroxytoluene, hindered amines, e.g., benzyl dimethyl amine ("BDMA"), N,N-Dimethylbenzylamine, and boron complexes.

In one embodiment, the photocurable composition of the present invention includes from about 40-80% by weight of an epoxy-containing compound, from about 5-40% by weight of a difunctional meth(acrylate), from about 5-40% by weight of a polyol mixture containing a poly(oxytetramethylene)diol and polyether polyol, from about 0.2-10% by weight of a cationic photoinitiator, and from about 0.01-10% by weight of a free radical photoinitiator, where the % by weight is based on the total weight of the photocurable composition. Preferably, the photocurable composition comprises from about 50-70% by weight of an epoxy-containing compound, from about 10-25% by weight of a difunctional (meth)acrylate, from about 10% to about 20% by weight of a polyol mixture containing a poly(oxytetramethylene)diol and polyether polyol, from about 0.5-8% by weight of a cationic photoinitiator, and from about 0.5-5% by weight of a free radical photoinitiator where the % by weight is based on the total weight of the photocurable composition. More preferably, the photocurable composition comprises from about 55-65% by weight of an epoxy-containing compound, about 15-20% by weight of a difunctional (meth)acrylate, from about 12% to about 18% by weight of a polyol mixture containing a poly(oxytetramethylene)diol and polyether polyol, from about 1-6% by weight of a cationic photoinitiator, and from about 1-5% by weight of a free radical photoinitiator where the % by weight is based on the total weight of the composition.

The photocurable compositions of the present invention are formulated to produce a clear, low viscosity liquid which upon photopolymerization during a stereolithography process, produces an opaque-white ABS-like article. Because the photocurable composition is clear, in contrast to opaque liquid resins, the partially completed article can be viewed under the photocurable composition's surface during the process. This allows one to change process parameters on subsequent layers to optimize the article during build or abort the building of the article altogether if necessary.

As noted above, the article which may be produced from the photocurable composition of the present invention via stereolithography is an article having ABS-like properties. That is, the articles have similar color and light scattering characteristics as ABS and also feel like ABS. For example, the articles preferably have a tensile strength within the range from about 30-65 MPa, a tensile elongation at break within the range from about 2-110%, a flexural strength within the range from about 45-107 MPa, a flexural modulus within the range from about 1600-5900 MPa, a notched izod impact strength of less than 12 ft lb/in and a heat deflection temperature at (0.46 MPa) within the range from about 68-140° C.

The appearance of the article is also an important consideration. ABS has an opaque-white appearance. Therefore, a suitable article should also have an opaque-white appearance. The whiteness of the article can be adjusted accordingly by modifying the molar ratio of the polyols in the polyol mixture.

Stereolithography

A further aspect of the present invention includes a process for producing a three-dimensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the three-dimensional article.

In principle, any stereolithography machine may be used to carry out the inventive method. Stereolithography equipment is commercially available from various manufacturers. Table I lists examples of commercial stereolithography equipment available from 3D Systems Corp. (Valencia, Calif.).

| MACHINE | WAVELENGTH (nm) |
|---|---|
| SLA ® 250 | 325 |
| SLA ® 500 | 351 |
| SLA ® 3500 | 355 |
| SLA ® 5000 | 355 |
| SLA ® 7000 | 355 |
| Viper si2 ™ | 355 |

Most preferably, the stereolithography process for producing a three-dimensional article from the photocurable composition of the present invention includes preparing the surface of the composition to form the first layer and then recoating the first layer and each successive layer of the three-dimensional article with a Zephyr™ recoater (3D Systems Corp., Valencia, Calif.), or an equivalent thereof.

EXAMPLES

The general procedure used for preparing three-dimensional articles with stereolithography equipment is as follows. The photocurable composition is placed in a vat designed for use with the stereolithography equipment. The photocurable composition is poured into the vat within the machine at about 30° C. The surface of the composition, either in its entirety or in accordance with a predetermined pattern, is irradiated with a UV/VIS light source so that a layer of a desired thickness is cured and solidified in the irradiated area. A new layer of the photocurable composition is formed on the solidified layer. The new layer is likewise irradiated over the entire surface or in a predetermined pattern. The newly solidified layer adheres to the underlying solidified layer. The layer formation step and the irradiation step are repeated until a green model of multiple solidified layers is produced.

A "green model" is a three-dimensional article initially formed by the stereolithography process of layering and photocuring, where typically the layers are not completely cured. This permits successive layers to better adhere by bonding together when further cured. "Green strength" is a general term for mechanical performance properties of a green model, including modulus, strain, strength, hardness, and layer-to-layer adhesion. For example, green strength may be reported by measuring flexural modulus (ASTM D 790). An object having low green strength may deform under its own weight, or may sag or collapse during curing.

The green model is then washed in tripropylene glycol monomethyl ether ("TPM") and subsequently rinsed with water and dried with compressed air. The dried green model is next postcured with UV radiation in a postcure apparatus ("PCA") for about 60-90 minutes. "Postcuring" is the process of reacting a green model to further cure the partially cured layers. A green model may be postcured by exposure to heat, actinic radiation, or both.

Mixing of Formulations

The formulations indicated in the following examples are prepared by mixing the components, with a stirrer at 20 C, until a homogeneous composition is obtained.

Testing Procedures

The photosensitivity of the compositions is determined on so-called window panes. In this determination, single-layer test specimens are produced using different laser energies, and the layer thicknesses are measured. The plotting of the resulting layer thickness on a graph against the logarithm of the irradiation energy used gives the "working curve". The slope of this curve is termed Dp (depth of Penetration, in mils). The energy value at which the curve passes through the x-axis is termed Ec (Critical Energy, in mJ/cm2). Cf. P. Jacobs, Rapid Prototyping and Manufacturing, Soc. Of Manufacturing Engineers, 1992, pp 270 ff.). For each example described, the authors have chosen to report the energy required to fully polymerise a 0.10 mm layer, E4, in mJ/cm2.

The opacity of a cured sample is determined by measuring the lightness L* on a Minolta Spectrophotometer CM-2500d. L* varies from 0 (clear material) to 100 (opaque material). L* is measured on a 5×10×15 mm part built on a SLA7000 stereolithography apparatus, using the Dp and Ec calculated using the windowpanes procedure. The L* of a liquid resin is around 30. Picture 1 shows 4 parts with different values for L*, showing the increase in opacity from L*=55 (translucent) to L*=85.

Visual examination of cured parts has allowed the authors to classify the formulations in one of the 3 following categories, according to their opacity/whiteness:

L*<65 solid part appears hazy or opalescent to the eye, but not white

65<L*<69 solid part appears white to the eye, but the opacity is not complete

L*>69 solid part appears white and completely opaque to the eye

L*=69 has been defined by the author as the value for which parts appear opaque and white to the eye.

Mechanical and thermal properties are determined on parts fabricated by 90 min UV cure in a silicon mold, unless otherwise stated.

Mechanical testing of fully cured parts was done according to ISO standards. Parts have been conditioned 3-5 days at 23 C and 50% RH prior to testing.

| | ISO standard |
|---|---|
| Tensile properties elongation to break, strength, modulus | 527 |
| Flexural properties Maximum strength, modulus | 178 |
| Bend Notched Impact Resistance Fracture toughness (G1C), stress intensity coefficient (K1C) | 13586 |
| HDT at 1.8 MPa (or 0.45 MPa) Heat deflection temperature under 1.80 MPa or 0.45 MPa load | 75 |

The viscosity of the liquid mixtures (in mPa·S or cP) is determined at 30° C., using a Brookfield viscometer:

| Examples | Viscosity at 30 C. |
|---|---|
| 1 | 760 |
| 2 | 450 |
| 3 | 715 |

-continued

| Examples | Viscosity at 30 C. |
|---|---|
| 4 | 710 |
| 5 | 740 |
| 6 | 210 |
| 7 | 415 |
| 8 | 410 |
| 9 | 550 |
| 10 | 635 |
| 11 | 740 |
| 12 | 480 |
| 13 | 475 |
| 14 | 580 |
| 15 | 630 |
| 16 | 590 |
| 17 | 900 |
| 18 | 650 |
| 19 | 700 |
| 20 | 750 |
| 21 | 710 |
| 22 | 755 |
| 23 | 510 |
| 24 | 670 |
| 25 | 550 |
| 26 | 490 |
| 27 | 430 |
| 28 | 500 |
| 29 | 570 |
| 30 | n/a |
| 31 | 665 |
| 32 | 635 |
| 33 | 585 |
| 34 | 700 |
| 35 | 350 |
| 36 | 570 |
| 37 | 500 |
| 38 | 500 |
| 39 | 620 |
| 40 | 500 |

Components, other than (1) and (2) used in the examples:

| | Trade name | Chemical name | Source |
|---|---|---|---|
| epoxy | Uvacure 1500 | 3,4 epoxycyclohexylmethyl 3', 4'epoxycyclohexanecarboxylate | Cytec |
| | Epalloy 5000 | Hydrogenated bisphenol A diglycidyl ether | CVC Chemicals |
| | Erisys GE 30 | Trimethylol propane triglycidyl ether | CVC Chemicals |
| oxetane | OXT-101 | 3-ethyl-3-hydroxymethyl oxetane | Toagosei |
| Acrylate | CN120 | Bisphenol A epoxy diacrylate | Sartomer Co. |
| | CN2301 | Hyperbranched polyester acrylate oligomer | Sartomer Co. |
| | SR833S | Tricyclodecane dimethanol diacrylate | Sartomer Co. |
| Free radical photoinitiator | Irgacure 184 | 1-hydroxycyclohexyl phenyl ketone | Ciba Specialty Chemicals |
| Cationic photoinitiator | CPI6976 | Mixture of PhS—(C6H4)—S + Ph2 SbF6— and Ph2S + —(C6H4)S(C6H4)—S + Ph2—(SbF6—)2 | Aceto Corp. |
| | Esacure1064 | Mixture of PhS—(C6H4)—S + —Ph2 PF6— and Ph2S + —(C6H4)—S—(C6H4)—S + Ph2 (PF6—)2 | Lamberti |

Examples 1-4

| | Example 1 Comparative | Example 2 | Example 3 Comparative | Example 4 |
|---|---|---|---|---|
| Epalloy 5000 | 40.9 | 38.4 | 36.9 | 34.4 |
| Erisys GE 30 | 12 | 12 | 12 | 12 |
| CN2301 | 5 | 5 | 5 | 5 |
| SR833S | 20.1 | 20.1 | 20.1 | 20.1 |
| Cyclohexane dimethanol (component (1)) | 0 | 2.5 | 0 | 2.5 |
| Terathane 1000 (component (1)) | 0 | 0 | 4 | 4 |
| Acclaim 12200 (component (2)) | 15 | 15 | 15 | 15 |
| IRG 184 | 2 | 2 | 2 | 2 |
| CPI6976 | 5 | 5 | 5 | 5 |

| | Example 1 Comparative | 2 | 3 | 4 |
|---|---|---|---|---|
| E4 (mJ/cm2) | 52.1 | 55.8 | 46.0 | 43.9 |
| Colour (L*) | 65 | 72 | 69 | 74 |

It has been surprisingly found that the addition of a small amount of component (1) to comparative composition 1, allows to fabricate a white solid part when submitting the clear liquid compositions 2, 3 and 4 (L* equal or greater than 69). The parts manufactured by UV-curing composition 1 show a slight opalescence and do not appear white to the eye (L* is smaller than 69). This increase in whiteness, when adding a small amount of component (1), was unexpected. While not willing to be bound to any theory, the inventors attribute it to an increase in the extend of the phase separation of component (2), enhanced by component (1).

In this regards, Terathane 1000 is one of the largest linear component (1) investigated by the author. It has been found that smaller (1) components are more efficient at driving phase separation and improving mechanical properties.

This unforeseen increase in phase separation not only gives nicer white parts, obtained from a clear liquid but also surprisingly provides, as shown in the following examples, improved impact resistance, without loss of temperature resistance (the HDT is even slightly increased in some instances).

Examples 5-22

The following examples show the extend of this unexpected invention. A number of components (1) have been evaluated, with various chemical structures. Most of them are alcohols of various functionality, class, molecular weights. An acrylate and an epoxy have also been evaluated as component (1).

| Component (1) Trade name | Source | MW (g/mol) | Functionality | Class | OH-number (mg KOH/g) |
|---|---|---|---|---|---|
| Isopropanol | Sigma-Aldrich | 60 | 1 | secondary | 60 |
| Diethylene glycol | Sigma-Aldrich | 106 | 2 | Primary | 53 |
| 2,3-Butanediol | Sigma-Aldrich | 90 | 2 | Secondary | 45 |
| Pinacol | Sigma-Aldrich | 118 | 2 | Tertiary | 59 |
| Cyclohexane dimethanol | Sigma-Aldrich | 144 | 2 | Primary | 57 |
| Terathane 250 (polytetrahydrofuran) | Invista | 250 | 2 | Primary | 125 |
| Terathane 650 (polytetrahydrofuran) | Invista | 650 | 2 | Primary | 325 |
| Terathane 1000 (polytetrahydrofuran) | Invista | 1000 | 2 | Primary | 500 |
| Desmophen PU21IK01 (branched polyether-based polyol) | Bayer | 4800 | 2.8-3.2 | n/a | 1500-1700 |
| CD406 (Cyclohexane dimethanol diacrylate) | Sartomer | 252 | 2 | / | 0 |
| Grilonite F-713 (epoxidised polytetrahydrofuran) | EMS-Primid | 890 | 2 | / | 0 |

TERATHANE® is a polytetramethyleneetherglycol also referred to as PTMO or, PTMG. It is a family of linear diols in which the hydroxyl groups are separated by repeating tetramethylene ether groups The general formula is HO(CH2CH2CH2CH2O)nH. For example, in TERATHANE® 1000 n averages 14. TERATHANE® Polytetramethylene ether glycol or PTMEG (also referred to as PTMO or, PTMG) is a family of linear diols in which the hydroxyl groups are separated by repeating tetramethylene ether groups.

For example, in TERATHANE® 1000 n averages 14 or in TERATHANE®2000, n averages about 27. is available in a variety of molecular weights. Below 650 molecular weight they are liquids at room temperature while above 1000 molecular weight they are low melting waxy white solids.

Examples 5 to 16 exemplify formulations based on cycloaliphatic epoxy and Acclaim® 6300 while examples 17 to 22 exemplify formulations based on diglycidyl ether and Acclaim® 12200. The phase separation concept can be applied to any epoxy resins, and is not limited to cycloaliphatic epoxy resin.

| | Examples | | | | | | | |
|---|---|---|---|---|---|---|---|---|
| | 5 Comparative | 6 | 7 | 8 | 9 | 10 | 11 | 12 |
| Uvacure 1500 | 65 | 58.7 | 58.7 | 58.7 | 58.7 | 58.7 | 58.7 | 58.7 |
| CN120 | 18 | 18 | 18 | 18 | 18 | 18 | 18 | 18 |
| Isopropanol | | 6.3 | | | | | | |
| Diethylene glycol | | | 6.3 | | | | | |
| 2,3-Butanediol | | | | 6.3 | | | | |
| Pinacol | | | | | 6.3 | | | |
| Cyclohexane dimethanol | | | | | | 6.3 | | |
| Desmophen PU21IK01 | | | | | | | 6.3 | |
| CD406 | | | | | | | | 6.3 |
| Acclaim ® 6300 | 10 | 10 | 10 | 10 | 10 | 10 | 10 | 10 |
| Irgacure 184 | 2 | 2 | 2 | 2 | 2 | 2 | 2 | 2 |
| CPI6976 | 5 | 55 | 5 | 5 | 5 | 5 | 5 | 5 |

Acclaim® products are polyether polyol products from Bayer, with MW around 6000 (Acclaim® 6300) or around 11200 (Acclaim®12200).

| Examples | 5 | 6 | 7 | 8 | 9 | 10 | 11 | 12 |
|---|---|---|---|---|---|---|---|---|
| E4 (mJ/cm2) | 35.7 | 38.4 | 15.8 | 20.2 | 16.7 | 39.8 | 33.6 | 33.7 |
| L* | 72 | >70 (1) | 84.5 | 83.5 | 79.5 | 81.5 | 73 | 74.5 |
| Tensile modulus (MPa) | 1085 | n/a | 2270 | 2365 | 1890 | 1850 | 1305 | 1330 |
| Elong. At break (%) | 0.9 | n/a | 2.4 | 2.2 | 2.7 | 3.0 | 4.5 | 2.2 |
| Flexural modulus (MPa) | 950 | n/a | 1840 | 2030 | 1640 | 1850 | 1635 | 988 |

-continued

| Examples | 5 | 6 | 7 | 8 | 9 | 10 | 11 | 12 |
|---|---|---|---|---|---|---|---|---|
| K1C (Mpa · √m) | 0.29 | n/a | 0.55 | 0.44 | 0.68 | 0.59 | 0.54 | 0.31 |
| G1C (J.m$^2$) | 75 | n/a | 139 | 81 | 236 | 169 | 152 | 83 |
| HDT at 1.8 MPa (° C.) | 51.1 | n/a | 53.2 | n/a | n/a | 52.8 | 50.7 | 51.1 |

(1) visual estimation, not measured.

Example 5 constitute the comparative example for this series. It is very clear from the increase in L* that the small alcohols tested enhance the phase separation of the larger polyol (Acclaim 6300 in this series), while at the same time, increasing the overall mechanical properties (modulus and impact resistance) as well as slightly increasing the temperature resistance. This result, in itself, is unexpected: the general tendency when toughening is increased is to observe a drop in temperature resistance. Inducing, simply by adding a small amount of component (1) in example 5, a better phase separation along with a higher impact resistance and a maintained or improved HDT, is the object of this invention. Example 12 is another comparative example showing that replacing the cyclohexane dimethanol (ex. 10) by its acrylated equivalent, while still providing a slight improvement in phase separation as compared to comparative example 5, does not provide improvement in temperature resistance nor mechanical performances.

Examples 13 to 16 show an interesting trend of the effect of the size of the small component (1), on its efficiency to enhance the phase separation.

Examples 13 to 16 show that the molecular weight of the small component (1) affects the phase separation of the larger polyol (acclaim 6300). A lower molecular weight for (1) provides better phase separation as well as higher impact resistance. Replacing the terminal OH groups with epoxy groups (example 15, grilonite F-713) still gives large improvement over comparative example 5 and matches the effect of the OH-terminated polytetrahydrofuran component (1) of the series, in the order of MW. The lower MW Terathane 250 yields best compromise of toughening, opacity and modulus. Larger Components (1) are still having a positive effect on phase separation of the larger MW polyol, but to a lesser extend (examples 11 and 16).

These examples show that the small molecule (1) can be a small alcohol, either monofunctional or of higher functionality (above 3), its molecular weight can be as low as 60 g/mol, and up to 4800 g/mol, or possibly higher, the class of alcohol can be primary, secondary or tertiary. These examples show that the more efficient components (1) are the smallest alcohols. Example 15 shows that (1) can also be epoxy functionalised (diglycidyl ether). Example 12 shows that an acrylate is not as efficient as a small alcohol or an epoxy: it does increase the whiteness, but not the mechanical performances.

Examples 17 to 22 (the epoxy matrix is glycidyl ether-based)

| | Examples | | | |
|---|---|---|---|---|
| | 13 | 14 | 15 | 16 |
| Uvacure 1500 | 58.7 | 58.7 | 58.7 | 58.7 |
| CN120 | 18 | 18 | 18 | 18 |
| Terathane 250 | 6.3 | | | |
| Terathane 650 | | 6.3 | | |
| Grilonite F-713 | | | 6.3 | |
| Terathane 1000 | | | | 6.3 |
| Acclaim 6300 | 10 | 10 | 10 | 10 |
| Irgacure 184 | 2 | 2 | 2 | 2 |
| CPI6976 | 5 | 5 | 5 | 5 |
| | Cv1-63a | Cv1-71a | Cv1-87d | SI7585 |
| E4 (mJ/cm2) | 33.3 | 30.7 | 40.9 | 31.3 |
| L* | 83 | 80 | 73.5 | 77.5 |
| Tensile modulus (MPa) | 1660 | 1470 | 1550 | 1240 |
| Elong. At break (%) | 4.0 | 5.5 | 5.6 | 4.8 |
| Flexural modulus (MPa) | 1370 | 1390 | 1350 | 1200 |
| K1C (Mpa · √m) | 0.82 | 0.76 | 0.7 | 0.60 |
| G1C (J · m$^2$) | 410 | 347 | 315 | 247 |
| HDT at 1.8 MPa (° C.) | 54.5 | 51.6 | 54.9 | 54.4 |

| Examples | 17 | 18 | 19 | 20 | 21 | 22 |
|---|---|---|---|---|---|---|
| Epalloy 5000 | 38.9 | 38.9 | 38.9 | 38.9 | 38.9 | 38.9 |
| Erisys GE 30 | 12 | 12 | 12 | 12 | 12 | 12 |
| CN2301 | 5 | 5 | 5 | 5 | 5 | 5 |
| SR833S | 20.1 | 20.1 | 20.1 | 20.1 | 20.1 | 20.1 |
| Diethylene glycol | 2 | | | | | |
| 2,3-Butanediol | | 2 | | | | |
| Pinacol | | | 2 | | | |
| Cyclohexane dimethanol | | | | 2 | | |
| Terathane 250 | | | | | 2 | |
| Terathane 1000 | | | | | | 2 |
| Acclaim 12200 | 15 | 15 | 15 | 15 | 15 | 15 |
| Irgacure 184 | 2 | 2 | 2 | 2 | 2 | 2 |
| CPI6976 | 5 | 5 | 5 | 5 | 5 | 5 |

| Examples | 1 Comp. | 17 | 18 | 19 | 20 | 21 | 22 |
|---|---|---|---|---|---|---|---|
| E4 (mJ/cm2) | 52.1 | 49.1 | 47.7 | 38.5 | 42.0 | 36.2 | 36.3 |
| L* | 69 | 85 | 76 | 75 | 76 | 73 | 72 |
| Tensile modulus (MPa) | 440 | 1000 | 630 | 430 | 550 | 700 | n/a |
| Elong. At break (%) | 8 | 3.0 | 9.5 | 10.5 | 9.6 | 13 | n/a |
| Flexural modulus (MPa) | 290 | 780 | 400 | 360 | 400 | 580 | n/a |
| K1C (Mpa · √m) | 0.20 | 0.32 | 0.27 | 0.19 | 0.25 | 0.59 | n/a |
| G1C (J.m$^2$) | 121 | 111 | 154 | 84 | 126 | 485 | n/a |
| HDT at 1.8 MPa (° C.) | 35.3 | n/a | n/a | n/a | n/a | >43.1 C. | n/a |
| HDT at 0.45 MPa (° C.) | n/a | n/a | n/a | n/a | n/a | 43.1 | n/a |

For examples 17 to 22, the comparative example is example 1. Again, our invention is verified in this system: whitening of the parts (increase of L*), increase in moduli and increase in impact resistance as well as HDT, especially in ex. 21.

Examples 23 to 25

|  | Examples | | | | |
|---|---|---|---|---|---|
|  | 5 Comp. | 23 | 24 | 9 | 25 |
| Uvacure 1500 | 65 | 58.7 | 58.7 | 58.7 | 58.7 |
| CN120 | 18 | 18 | 18 | 18 | 18 |
| Terathane 250 | 0 | 2 | 4 | 6.3 | 8 |
| Acclaim 6300 | 10 | 10 | 10 | 10 | 10 |
| Irgacure 184 | 2 | 2 | 2 | 2 | 2 |
| CPI6976 | 5 | 5 | 5 | 5 | 5 |

|  | Examples | | | | |
|---|---|---|---|---|---|
|  | 5 Comp. | 23 | 24 | 13 | 25 |
| E4 (mJ/cm2) | 35.7 | 35.5 | 34.5 | 33.3 | 39.8 |
| L* | 72 | 80.5 | 82 | 83 | 83.5 |
| Tensile modulus (MPa) | 1085 | 1630 | 1760 | 1660 | 2020 |
| Elong. At break (%) | 0.9 | 2.9 | 3.6 | 4.0 | 3.2 |
| Flexural modulus (MPa) | 950 | 1610 | 1340 | 1370 | 1835 |
| K1C (Mpa·√m) | 0.29 | 0.66 | 0.74 | 0.82 | 0.83 |
| G1C (J·m²) | 75 | 229 | 347 | 410 | 316 |
| HDT at 1.8 MPa (° C.) | 51.1 | 57.3 | 56.2 | 54.5 | 56.9 |

Examples 23 to 25 interestingly shows that even the smallest amount of Terathane 250 has a tremendous effect on the phase separation, mechanical properties and temperature resistance. Example 23 in particular shows the effect of 2% of Terathane 250 on the toughening effect of the component (2).

These examples show that adding 0.2 g to 0.8 g of component (1) per gram of component (2) in the composition provides the beneficial effects.

Examples 26-33

Several polyols have been investigated as components (2), either alone or in combination:

| Component (2) | Supplier | OH number (mg KOH/g) | Viscosity at 25° C. (cps) | MW (g/mol) | Functionality | Class | Structure |
|---|---|---|---|---|---|---|---|
| PolyG20-56 |  | 56 | 325 | 2000 | 2 | Primary | Linear |
| Acclaim 4200 |  | 26.5-29.5 |  | 4000 | 2 | Secondary | Linear |
| Acclaim 6300 |  | 26.5-29.5 | 1470 | 6000 | 3 | Tertiary | 3-arm star |
| Acclaim 8200 |  | 13-15 | 3000 | 8000 | 2 | Primary | Linear |
| Acclaim 12200 |  | 9-11 | 6000 | 11200 | 2 | Primary | Linear |
| Desmophen PU21IK01 |  | 33-37 | 790-930 | 4800 | 3 | n/a | Branched |

PolyG20-56, Acclaim 4200, 6300, 8200, 12200 and desmophen PU21IK01 are polyether-based polyols.

| Examples | 26 | 27 | 28 | 29 | 30 | 31 | 32 | 33 |
|---|---|---|---|---|---|---|---|---|
| Uvacure 1500 | 58.7 |  |  |  |  |  |  |  |
| Epalloy 5000 |  | 40.1 | 40.1 | 40.1 | 36.05 | 36.9 | 36.9 | 36.9 |
| Erisys GE 30 |  | 12 | 12 | 12 | 10.8 | 12 | 12 | 12 |
| OXT-101 |  |  |  |  | 9 |  |  |  |
| CN120 | 18 |  |  |  |  |  |  |  |
| CN2301 |  | 5 | 5 | 5 | 4.5 | 5 | 5 | 5 |
| SR833 S |  | 20.1 | 20.1 | 20.1 | 18 | 20.1 | 20.1 | 20.1 |
| Diethylene glycol | 6.3 |  |  |  |  |  |  |  |
| Terathane 1000 |  | 6.3 | 6.3 | 6.3 | 5.65 | 4 | 4 | 4 |
| polyG20-56 |  |  |  |  |  |  |  | 3 |
| Acclaim 4200 |  |  |  |  |  |  | 3 |  |
| Acclaim 6300 |  | 10 |  |  |  | 3 |  |  |
| Acclaim 8200 |  |  | 10 |  |  |  |  |  |
| Acclaim 12200 |  |  |  | 10 | 9 | 12 | 12 | 12 |
| Desmophen PU21IK01 | 10 |  |  |  |  |  |  |  |
| Irgacure 184 | 2 | 1.5 | 1.5 | 1.5 | 2 | 2 | 2 | 2 |
| CPI6976 | 5 | 5 | 5 | 5 | 5 | 5 | 5 | 5 |
| E4 (mJ/cm2) | 33.8 | 46.4 | 44.7 | 44.3 | 46.1 | 43.2 | 36.9 | 29.2 |
| L* | 57 | 52 | 56 | 68.5 | 75 | 68 | 73 | 71 |
| Tensile modulus (MPa) | 1480 | n/a | n/a | n/a | n/a | n/a | n/a | 360 |
| Elong. At break (%) | 1.7 | n/a | n/a | n/a | n/a | n/a | n/a | 14.5 |
| Flexural modulus (MPa) | 1080 | n/a | n/a | n/a | n/a | n/a | n/a | 350 |

-continued

| Examples | 26 | 27 | 28 | 29 | 30 | 31 | 32 | 33 |
|---|---|---|---|---|---|---|---|---|
| K1C | 0.96 | n/a | n/a | n/a | n/a | n/a | n/a | 0.40 |
| G1C | 754 | n/a | n/a | n/a | n/a | n/a | n/a | 386 |
| HDT at 0.45 MPa (° C.) | n/a | n/a | n/a | n/a | n/a | n/a | n/a | 39.8 |

Examples 26 and Ex. 7 comparison: component (2) is a branched polyether: it is clearly shown that there is a minimum MW of component (2) for which the component (1) can enhance the phase separation: for a non-linear polyether-based polyol, a MW of 4800 g/mol does not phase separate to give white parts, while a MW of 6000 g/mol allows the production of white parts. (As been verified by the authors for the resin system based on cycloaliphatic epoxy. The MW boundary, positioned between 4800 and 6000 g/mol in this instance could be different for a glycidyl ether-based resin).

A similar trend has been revealed in Ex. 27 to 33 for a glycidyl ether-based resin, with linear polyether-based polyol component (2). In this system, it is clearly shown that the whitening effect increases with the MW of the linear polyol. The whitening effect can further be intensified by using a mixture of 2 components (2), or by addition of an cationically polymerisable oxetane (Ex. 30).

Examples 34 to 36

|  | 34 | 35 | 36 |
|---|---|---|---|
| Epalloy 5000 |  | 33 | 35 |
| Uvacure 1500 | 58.7 |  |  |
| OXT-101 |  | 15 | 15 |
| CN120 | 18 |  |  |
| CN2301 |  | 5 | 5 |
| SR833S |  | 23 | 23 |
| Diethylene glycol |  | 2 |  |
| Terathane 1000 | 6.3 |  |  |
| Acclaim 6300 | 10 |  |  |
| Acclaim 12200 |  | 15 | 15 |
| Irgacure 184 | 2 | 2 | 2 |
| Esacure 1064 | 5 | 5 | 5 |
|  | Lcm-b031 | Cv1-82a | Cv1-82b |
| E4 (mJ/cm2) | 23.9 | 66.1 | 49.8 |
| L* | 83 | 82.5 | 80.5 |

The invention is not limited to use of SbF6 sulfonium salts at cationic photoinitiators. Using the PF6 sulfonium salts provides even whiter parts, as exemplified in Ex. 34, to be compared to Ex. 15, the SbF6 sulfonium salts equivalent.

Example 37

Effect on Part Post-Processing on Properties and Color

|  | 37 LMB 5874 |
|---|---|
| Epalloy 5000 | 26.9 |
| Erisys GE 30 | 16 |
| Uvacure 1500 | 10 |
| CN2301 | 5 |

-continued

|  | 37 LMB 5874 |
|---|---|
| SR833S | 20.1 |
| Terathane 1000 | 4 |
| Terathane 250 |  |
| Acclaim 12200 | 11 |
| Irgacure 184 | 2 |
| CPI6976 | 5 |

|  | 37 LMB 5874 Parts fabricated in SLA7000 PCA post cure for 90 min | 37 LMB 5874 Parts fabricated in SLA7000 PCA post cure for 90 min + thermal post-cure 2 h at 80 C. | 37 LMB 5874 Parts fabricated in SLA7000 PCA post cure for 90 min + 30 dazs ageing at 23 C., 50% RH |
|---|---|---|---|
| E4 (mJ/cm2) | 28.4 | 28.4 | 28.4 |
| L* | 77.5 | 83 | n/a |
| Tensile modulus (MPa) | 1110 | 1200 | 875 |
| Elong. At break (%) | 10.1 | 10.3 | 12.7 |
| Flexural modulus (MPa) | 1150 | 1140 | 970 |
| K1C | 0.84 | 0.87 | 0.80 |
| G1C | 510 | 560 | 570 |
| HDT at 0.45 MPa (° C.) | 56.4 | 55.8 | 50 |

The effect of post processing after fabrication of parts on a SLA7000 on the mechanical and thermal properties as well as on the parts colour have been reported for Ex. 40. It is extremely interesting to note that the parts mechanical and thermal properties have not been degraded upon thermal post cure at 80 C: the enhanced phase separation not only provides a tougher system, but also prevents the mechanical properties from evolving upon thermal post cure. The effect of such treatment on parts photofabricated from most of hybrid epoxy-acrylate systems is loss of impact resistance and elongation to break, an increase of moduli, and thermal resistance: parts become more brittle. In this invention, parts do not become more brittleupon thermal treatment.

Upon ageing at 23 C and 50% RH for 30 days, moisture pick up has slightly plasticised the samples, and caused the parts to soften and reduced the moduli. However, this effect is minimal, and parts properties have all been retained at 79 to 88%. It is the belief of the inventors that upon drying, the parts' performances will be retrieved.

Examples 38 to 40

|  | 38 | 39 | 40 |
|---|---|---|---|
| Epalloy 5000 | 26.9 | 26.9 | 26.9 |
| Erisys GE 30 | 14 | 16 | 10 |
| Uvacure 1500 | 12 | 10 | 16 |
| CN2301 | 5 | 5 | 5 |
| SR833S | 20.1 | 20.1 | 20.1 |
| Terathane 1000 | 4 |  | 4 |
| Terathane 250 |  | 4 |  |
| Acclaim 12200 | 11 | 11 | 11 |
| Irgacure 184 | 2 | 2 | 2 |
| CPI6976 | 5 | 5 | 5 |

|  | Parts fabricated in SLA7000 PCA post cure for 90 min | Parts fabricated in SLA7000 PCA post cure for 90 min | Parts fabricated in SLA7000 PCA post cure for 90 min |
|---|---|---|---|
| E4 (mJ/cm2) | 30.45 | 37.6 | 32.5 |
| L* | 77.5 | 78 | 77.5 |
| Tensile modulus (MPa) | 1440 | 1200 | 1360 |
| Elong. At break (%) | 5.7 | 10.2 | 9.2 |
| Flexural modulus (MPa) | 1370 | 1130 | 1310 |
| K1C | 1.1 | 1.0 | 0.95 |
| G1C | 729 | 732 | 580 |
| HDT at 0.45 MPa (° C.) | 57.3 | 52.5 | 54 |

The table below lists the components of each photocurable composition labeled as Examples 41-43. The numbers in the table refer to the weight percent of each component based on the total weight of the composition. The next Table provides further identifying information for the trade names in the below Table.

| Component | Example 1 (% by weight) | Example 2 (% by weight) | Example 3 (% by weight |
|---|---|---|---|
| UVACURE 1500 | 62.3 | 60.6 | 58.6 |
| Ebecryl 3700 | 18 | 18 | 18 |
| Polymeg 1000 | 6.3 | 6.3 | 6.3 |
| Arcol LHT 28 | 6.3 |  |  |
| Acclaim 6300 |  | 8 | 10 |
| Irgacure 184 | 2 | 2 | 2 |
| UVI 6976 | 5 | 5 | 5 |
| Stabilizers | 0.1 | 0.1 | 0.1 |
| Total % by weight | 100 | 100 | 100 |

| Component | Source | Chemical Name |
|---|---|---|
| UVACURE 1500 | UCB Surface Specialties | 3,4-Epoxycyclohexylmethyl 3',4'-epoxycyclohexanecarboxylate |
| Ebecryl 3700 | UCB Surface Specialties | Bisphenol-A epoxy diacrylate |
| Polymeg 1000 | Penn Specialty Chemicals | Polytetramethylene ether glycol (MW ca. 1000) |
| Arcol LHT 28 | Bayer | Polyether polyol (MW ca. 6000) |
| Acclaim 6300 | Bayer | Polyether polyol (MW ca. 6000) |
| Irgacure 184 | Ciba Specialty Chemicals | 1-hydroxycyclohexyl phenyl ketone |
| UVI 6976 | Dow Chemical Co. | Mixture of PhS—($C_6H_4$)—S + $Ph_2SbF_6$ and $Ph_2$—($C_6H_4$)—S—($C_6H_4$)—S + $Ph_2(SbF_6)_2$ |

Examples 41-43 were prepared by combining the components and mixing at room temperature until the mixture was a homogeneous photocurable composition. The viscosity and appearance of the photocurable compositions are shown below:

| Property | Example 41 | Example 42 | Example 43 |
|---|---|---|---|
| Appearance | Clear | Clear | Clear |
| Viscosity |  |  |  |
| at 25° C. (mPas) | 917 | 980 | 1100 |
| at 35° C. (mPas) | 626 | 645 | 718 |

Three dimensional articles were then prepared from the photocurable compositions on an SLA 7000 machine. The articles, having a layer thickness of 0.1 mm, were built using a depth of penetration of 4.8 mil and a critical energy of 9.7 mJ/cm$^2$. All articles were white having green strengths of 94-106 MPa at 10 minutes and 267-303 MPa at 60 minutes.

Immediately after the three-dimensional articles were imaged on the SLA 7000 machine, they were washed in TPM, rinsed with water, and dried with pressurized air. After drying, the articles were removed from their supports and placed on an elevated glass platform in a PCA and an intensity of at least 320 watts of fluorescent light was delivered over 1.5 hours.

Tensile properties of the cured articles were measured using a United Testing Systems Tensile Tester. Specifications for the United Tensile Testing Tester are as follows:

| Pre-Test Speed | 5 mm/min |
|---|---|
| Pre-Load | 0.05 kg |
| Test Speed | 5 mm/min |
| Maximum Load | 500 lbs |
| Extensiometer | 1 inch |

"Pre-Test Speed" is the rate at which the three-dimensional article is pulled taut before the testing begins.
"Pre-Load" is the amount of force that is applied to the three-dimensional article (at the Pre-Test Speed) before the testing begins.
"Test Speed" is the rate at which the three-dimensional article is pulled apart during the test process.
"Maximum Load" is the maximum amount of force that the United Testing Systems Tensile Tester can use when testing a specimen.
"Extensiometer" is a device that grips the three-dimensional article between two teeth having a distance between the teeth of one inch. A spring on the extensiometer measures the distance to which the three-dimensional article is stretched.

The articles of Examples 41-43 were then further exposed to a temperature of 80° C. for 2 hours and the tensile properties measured as described above.

| Property | Example 41 | Example 42 | Example 43 |
|---|---|---|---|
| 1.5 hours PCA oven | | | |
| Flexural Strength (MPa) | 54 | 61 | 46 |
| Flexural Modulus (MPa) | 1806 | 2010 | 1478 |
| Tensile Strength (MPa) | 46 | 44 | 38 |
| Tensile Modulus (MPa) | 1436 | 1293 | 1193 |
| Tensile Elongation at Break (%) | 6 | 7 | 6 |
| Heat Deflection Temp at 0.45 MPa (° C.) | 71.5 | 68.6 | 71.6 |
| Notched Izod Impact Resistance (ft lbs/in) | 0.51 | 0.53 | 0.38 |
| 1.5 hours PCA oven + 2 hours at 80° C. | | | |
| Flexural Strength (MPa) | 69 | 55 | 52 |
| Flexural Modulus (MPa) | 2121 | 1828 | 1661 |

-continued

| Property | Example 41 | Example 42 | Example 43 |
| --- | --- | --- | --- |
| Tensile Strength (MPa) | 61 | 60 | 54 |
| Tensile Modulus (MPa) | 1758 | 1553 | 1509 |
| Tensile Elongation at Break (%) | 5 | 6 | 5 |
| Heat Deflection Temp at 0.45 MPa (° C.) | 120 | 113.8 | 109.3 |
| Notched Izod Impact Resistance (ft lbs/in) | 0.39 | 0.4 | 0.28 |

The clear photocurable compositions of Examples 41-43 produced articles having an opaque-white appearance that looked similar to ABS. The mechanical physical properties of these articles also compare favorably to those of ABS. It is of significant importance to note that a balance of high heat deflection temperature, flexibility and impact resistance is retained in the articles after heat is applied postcure; typically, there is significant decrease in impact resistance and an increase in brittleness when a cured article is further heated. Example 41 with Arcol LHT 28 is especially interesting as it has a low molecular weight fraction as well as high molecular weight fraction and gives best results.

Although making and using various embodiments of the present invention have been described in detail above, it should be appreciated that the present invention provides many applicable inventive concepts that can be embodied in a wide variety of specific contexts. The specific embodiments discussed herein are merely illustrative of specific ways to make and use the invention, and do not delimit the scope of the invention.

What is claimed is:

1. A photocurable composition comprising:
   a. 30%-80% by weight of an epoxy-containing compound;
   b. 5-40% by weight of a polyfunctional (meth)acrylate;
   c. 5-40% by weight of a mixture of polyol (1) and polyol (2), wherein polyol (1) is different than polyol (2) and polyol (2) has a higher hydroxyl equivalent weight than polyol (1) and wherein polyol (1) has a hydroxyl equivalent weight of 180 to 1500 g/OH equivalent and polyol (2) has a hydroxyl equivalent weight of 230 to 7000 g/OH equivalent;
   d. a cationic photoinitiator;
   e. a free radical photoinitiator; and optionally
   f. one or more stabilizers wherein the percent by weight is based on the total weight of the photocurable composition and wherein the photocurable composition is a clear liquid.

2. The photocurable composition of claim 1 wherein the polyol (1) is a polyol selected from the group consisting of poly(oxytetramethylene) polyol, poly(oxypropylene) polyol, poly(oxyethylene) polyol, hydroxy-terminated polybutadiene and hydroxy-terminated polysiloxane.

3. The photocurable composition of claim 2 wherein the polyol (1) is poly(oxytetramethylene) polyol.

4. The photocurable composition of claim 2 wherein the polyol (2) is selected from the group consisting of polyether polyol, polyester polyol and polyurethane polyol.

5. The photocurable composition of claim 1 which, after cure by exposure to actinic radiation is opaque.

6. The photocurable composition of claim 1 which, after cure by exposure to actinic radiation is opaque-white that simulates acrylonitrile-butadiene-styrene.

7. The photocurable composition of claim 1 wherein the molar ratio of the polyol (1) over the polyol (2) is equal to or less than 20.

8. The photocurable composition of claim 1 wherein the polyol (1) has a hydroxyl equivalent weight of 200 to 1000 g/OH equivalent.

9. The photocurable composition of claim 1 wherein the polyol (2) has a hydroxyl equivalent weight of 1300 to 1500 g/OH equivalent.

10. The photocurable composition of claim 1 wherein the cationic photoinitiator comprises a $PF_6$ salt.

11. The photocurable composition of claim 1 wherein polyol (1) is the same generic compound as polyol (2) and polyol (1) and polyol (2) vary according to weight average molecular weight.

12. The photocurable composition of claim 1 wherein polyol (1) is a different compound than polyol (2) and polyol (1) and polyol (2) vary according to weight average molecular weight.

13. A process comprising:
   a. coating a layer of the photocurable composition of claim 1 onto a surface;
   b. exposing the layer imagewise to actinic radiation to form an imaged cross-section, wherein the radiation is of sufficient intensity to cause substantial curing of the layer in the exposed areas;
   c. coating a thin layer of the composition of claim 1 onto the previously exposed imaged cross-section;
   d. exposing the thin layer from step (c) imagewise to actinic radiation to form an additional imaged cross-section, wherein the radiation is of sufficient intensity to cause substantial curing of the thin layer in the exposed areas and to cause adhesion to the previously exposed imaged cross-section; and
   repeating steps (c) and (d) a sufficient number of times in order to build up a three-dimensional article.

14. A three-dimensional article produced by a process comprising:
   a. coating a layer of the photocurable composition of claim 1 onto a surface;
   b. exposing the layer imagewise to actinic radiation to form an imaged cross-section, wherein the radiation is of sufficient intensity to cause substantial curing of the layer in the exposed areas;
   c. coating a thin layer of the composition of claim 1 onto the previously exposed imaged cross-section;
   d. exposing the thin layer from step (c) imagewise to actinic radiation to form an additional imaged cross-section, wherein the radiation is of sufficient intensity to cause substantial curing of the thin layer in the exposed areas and to cause adhesion to the previously exposed imaged cross-section; and
   repeating steps (c) and (d) a sufficient number of times in order to build up a three-dimensional article.

* * * * *